(12) United States Patent
Lee (10) Patent No.: US 8,445,934 B2
(45) Date of Patent: May 21, 2013

(54) ORGANIC LIGHT EMITTING DIODE DISPLAY AND METHOD FOR MANUFACTURING THE SAME

(75) Inventor: Kyung-Jun Lee, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 242 days.

(21) Appl. No.: 12/833,403

(22) Filed: Jul. 9, 2010

(65) Prior Publication Data
US 2011/0006335 A1    Jan. 13, 2011

(30) Foreign Application Priority Data
Jul. 10, 2009  (KR) .................. 10-2009-0063231

(51) Int. Cl.
*H01L 33/22* (2010.01)
*H01L 21/26* (2006.01)

(52) U.S. Cl.
USPC ............. 257/99; 257/100; 257/704; 257/787; 257/E21.502; 438/28; 438/112; 438/124; 438/127; 438/20

(58) Field of Classification Search
USPC ............ 257/99, 100, 704, 787, 687, E33.059, 257/E21.502; 438/28, 112, 124, 127, 50
See application file for complete search history.

(56) References Cited

U.S. PATENT DOCUMENTS
7,514,718 B2 *  4/2009  Shin et al. .................. 257/81

FOREIGN PATENT DOCUMENTS

| | | |
|---|---|---|
| GB | 2373095 A | 9/2002 |
| JP | 10-74582 A | 3/1998 |
| JP | 2001223077 | 8/2001 |
| JP | 2002-124381 | 4/2002 |
| JP | 2004288467 | 10/2004 |
| JP | 2006196879 | 7/2006 |
| JP | 2006-243502 | 9/2006 |
| JP | 2007-35322 A | 2/2007 |
| JP | 2008234921 | 10/2008 |
| JP | 2008235089 | 10/2008 |
| JP | 2008-292758 | 12/2008 |
| JP | 2009-047879 A | 3/2009 |
| KR | 10-2002-0031251 | 5/2002 |
| KR | 10-2004-0078037 | 9/2004 |
| KR | 10-2007-0004527 A | 1/2007 |

* cited by examiner

*Primary Examiner* — Thinh T Nguyen (74) *Attorney, Agent, or Firm* — Robert E. Bushnell, Esq.

(57) ABSTRACT

An organic light emitting diode (OLED) display includes a display substrate including an organic light emitting element, an encapsulation substrate arranged opposite to the display substrate and covering the organic light emitting element, a sealant disposed on the edge of the display substrate and the encapsulation substrate, and sealing the display substrate and the encapsulation substrate to each other; and a filler filling the space between the display substrate and the encapsulation substrate. One surface of at least one of the display substrate and the encapsulation substrate is contacted with the filler and is divided into a hydrophobic region and a hydrophilic region, and the hydrophobic region is positioned between the hydrophilic region and the sealant.

29 Claims, 11 Drawing Sheets

ORGANIC LIGHT EMITTING DIODE DISPLAY AND METHOD FOR MANUFACTURING THE SAME

CLAIM OF PRIORITY

This application claims priority to and the benefit of Korean Patent Application No. 10-2009-0063231 filed in the Korean Intellectual Property Office on Jul. 10, 2009, the entire contents of which are incorporated herein by reference.

BACKGROUND OF THE INVENTION

1. Field of the Invention

The described technology relates generally to an organic light emitting diode (OLED) display and a manufacturing method thereof. More particularly, the described technology relates generally to an organic light emitting diode (OLED) display and a manufacturing method thereof for improving durability and suppressing deterioration thereof.

2. Description of the Related Art

An OLED display has self-luminance characteristics, and the thickness and weight thereof can be reduced since a separate light source is not required, unlike a liquid crystal display (LCD). Further, because the OLED display has high quality characteristics such as low power consumption, high luminance, and high response time, the OLED display has been spotlighted as a next generation display device for portable electronic devices.

In general, an OLED display includes a display substrate including organic light emitting elements, an encapsulation substrate arranged opposite to the display substrate thereby protecting the organic light emitting elements, and a sealant that bonds the display substrate and the encapsulation substrate. However, empty space exists between the display substrate and the encapsulation substrate such that the mechanical strength of the organic light emitting diode (OLED) display is weakened.

In order to address this problem, the empty space between the display substrate and the encapsulation substrate is filled with a filler through a vacuum bonding process to improve durability against external impact.

However, when the space between the display substrate and the encapsulation substrate is filled with filler, the filler contacts the sealant formed along the edges of the display and encapsulation substrates. In this case, the filler negatively impacts the process for hardening the sealant. The sealant may not stably seal and bond the display substrate and the encapsulation substrate.

The above information disclosed in this Background section is only for enhancement of understanding of the background of the described technology and therefore it may contain information that is not a part of the prior art, i.e., material that was already known in this country to a person of ordinary skill in the art.

SUMMARY OF THE INVENTION

The described technology has been made in an effort to provide an organic light emitting diode display (OLED) having the advantages of improving durability and suppressing defects.

In addition, the present invention provides a method for manufacturing an OLED display.

An organic light emitting diode (OLED) display according to an exemplary embodiment includes: a display substrate including an organic light emitting element; an encapsulation substrate arranged opposite to the display substrate and covering the organic light emitting element; a sealant disposed on the edge of the display substrate and the encapsulation substrate, wherein the display substrate and the encapsulation substrate are sealed to each other; and a filler filling the space between the display substrate and the encapsulation substrate. One surface of at least one of the display substrate and the encapsulation substrate is contacted with the filler and is divided into a hydrophobic region and a hydrophilic region, and the hydrophobic region is positioned between the hydrophilic region and the sealant.

The hydrophilic region may include a drop point, and the filler may be dripped from the drop point and diffuse in a sealant direction.

The filler may have a higher contact angle in the hydrophobic region than the hydrophilic region.

The hydrophobic region may be formed by being contacted with a material including polydimethylsiloxane (PDMS).

The hydrophobic region may be formed by printing a hydrophobic ink.

The hydrophobic ink may include at least one of polytetrafluoroethylene (PTFE), fluoroethylenepropylene (FEP), perfluoroalkoxy (PFA), or polyvinylidene fluoride (PVDF).

The hydrophilic region may be disposed at the central part thereof, and the hydrophobic region may enclose the hydrophilic region.

The hydrophilic region may have a circular (or approximately circular) shape.

The hydrophilic region may have an oval (or approximately oval) shape including a long axis parallel to the long edge of the display substrate and a short axis parallel to the short edge of the display substrate.

Two hydrophilic regions may have generally circular shapes.

A plurality of hydrophilic regions may have generally circular shapes.

Two or more drop points may be disposed, and the drop points may be arranged in the direction parallel to the long edge of the display substrate.

A plurality of drop points may be disposed, and the plurality of drop points may be distributed on a plurality of hydrophilic regions.

A plurality of drop points may have various sizes, and the plurality of hydrophilic regions including the plurality of drop points may have various sizes.

A plurality of drop points may include a first drop point and a second drop point having a larger size than the first drop point, the hydrophilic region including the second drop point may be larger than the hydrophilic region including the first drop point, and the amount of the filler dripped through the first drop point may be smaller than the amount of the filler dripped through the second drop point.

A first drop point and a second drop point may be alternately arranged.

A second drop point may be disposed close to each corner of the display substrate.

A manufacturing method of an organic light emitting diode (OLED) display according to an exemplary embodiment includes: surface-treating at least one substrate of a display substrate and an encapsulation substrate thereby dividing into a hydrophilic region where a drop point is positioned and a hydrophobic region enclosing the hydrophilic region; disposing a sealant on at least one substrate of the display substrate or the encapsulation substrate on an edge; dripping a filler at a drop point and allowing the filler to diffuse into the surrounding area; and contacting and sealing the display substrate or the encapsulation substrate with the sealant and the filler interposed therebetween.

The hydrophobic region may be disposed close to the sealant.

The filler may have a higher contact angle in the hydrophobic region than the hydrophilic region.

The hydrophobic region may be formed by being contacted with a material including polydimethylsiloxane (PDMS).

The hydrophobic region may be formed by printing a hydrophobic ink.

The hydrophobic ink may include at least one of polytetrafluoroethylene (PTFE), fluoroethylenepropylene (FEP), perfluoroalkoxy (PFA), or polyvinylidene fluoride (PVDF).

The hydrophilic region may have a circular (or approximately circular) shape.

The hydrophilic region may have an oval (or approximately oval) shape including a long axis parallel to the long edge of the display substrate and a short axis parallel to the short edge of the display substrate.

Two or more drop points may be disposed, and the drop points may be arranged in the direction parallel to the long edge of the display substrate.

A plurality of drop points may have various sizes, and the plurality of drop points may be distributed on the hydrophilic region.

A plurality of drop points may have various sizes, and the hydrophilic region including the plurality of drop points may have various sizes.

A plurality of drop points may include a first drop point and a second drop point having a larger size than the first drop point, the hydrophilic region including the second drop point may be larger than the hydrophilic region including the first drop point, and the amount of the filler dripped through the first drop point may be smaller than the amount of the filler dripped through the second drop point.

A first drop point and a second drop point may be alternately arranged.

A second drop point may be disposed close to each corner of the display substrate.

According to the present invention, the durability of an organic light emitting diode (OLED) display against impact is improved, and sealant deterioration may be suppressed.

DETAILED DESCRIPTION

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In addition, when describing a variety of exemplary embodiments, like reference numerals designate like elements that will be described in a first exemplary embodiment. Therefore, in other exemplary embodiments, only different elements will be described.

Accordingly, the drawings and description are to be regarded as illustrative in nature and not restrictive. Like reference numerals designate like elements throughout the specification.

In order to clarify layers and regions, thicknesses and sizes thereof are exemplarily illustrated, and thus the present invention is not limited thereto.

In the drawings, the thickness of layers, films, panels, regions, etc., are exaggerated for clarity. In addition, in order to clarify some layers and some regions, thicknesses and sizes thereof are enlarged in the drawings. It will be understood that when an element such as a layer, film, region, or substrate is referred to as being "on" another element, it can be directly on the other element or intervening elements may also be present.

Further, although an active matrix type of OLED display of a 2Tr-1Cap structure in which one pixel has two thin film transistors and one capacitor is illustrated in the accompanying drawings, the present invention is not limited thereto. Therefore, the OLED display may be formed with pixels each having three or more thin film transistors and two or more capacitors. In addition, the OLED display may be formed in a variety of structures by adding additional metal lines. Here, the pixel is a minimum unit that can display an image, and the OLED display displays an image using a plurality of the pixels.

An OLED display in accordance with a first exemplary embodiment will be described hereinafter with reference to FIG. 1 and FIG. 2.

Figure 1:
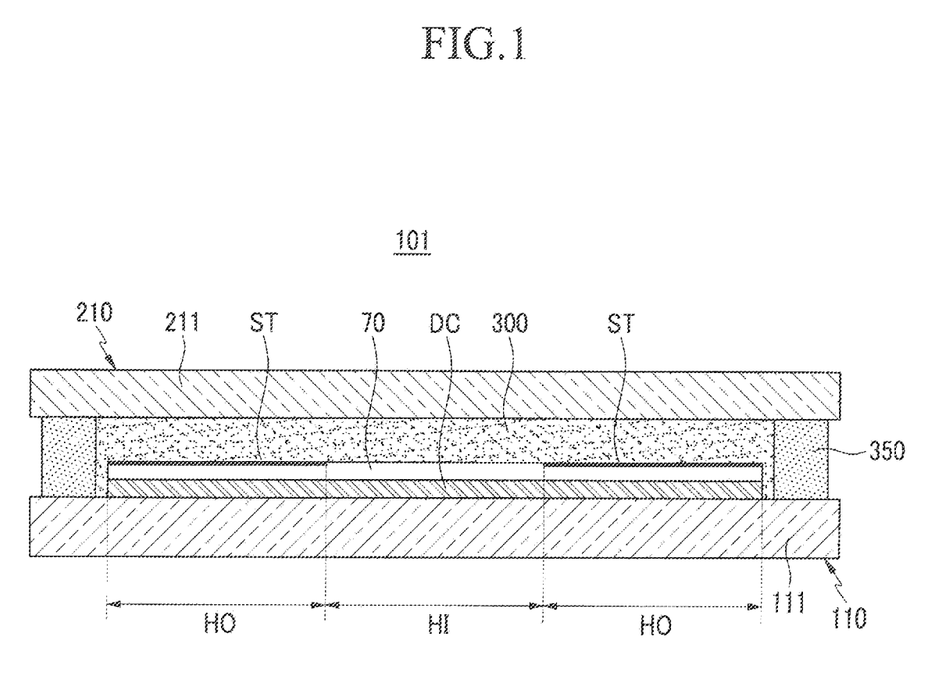
FIG. 1 is a cross-sectional view of an OLED display according to a first exemplary embodiment.

As shown in FIG. 1, an organic light emitting diode (OLED) display 101 according to the first exemplary embodiment includes a display substrate 110, an encapsulation substrate 210, a sealant 350, and a filler 300.

The display substrate 110 includes the first substrate main body 111, and a driving circuit DC and an organic light emitting element 70 formed on the first substrate main body 111.

The first substrate main body 111 may be made of an insulating substrate such as glass, quartz, ceramic, or plastic. However, the first exemplary embodiment is not limited thereto, and the first substrate main body 111 may be made of a metal substrate such as, for example, stainless steel.

Figure 5:
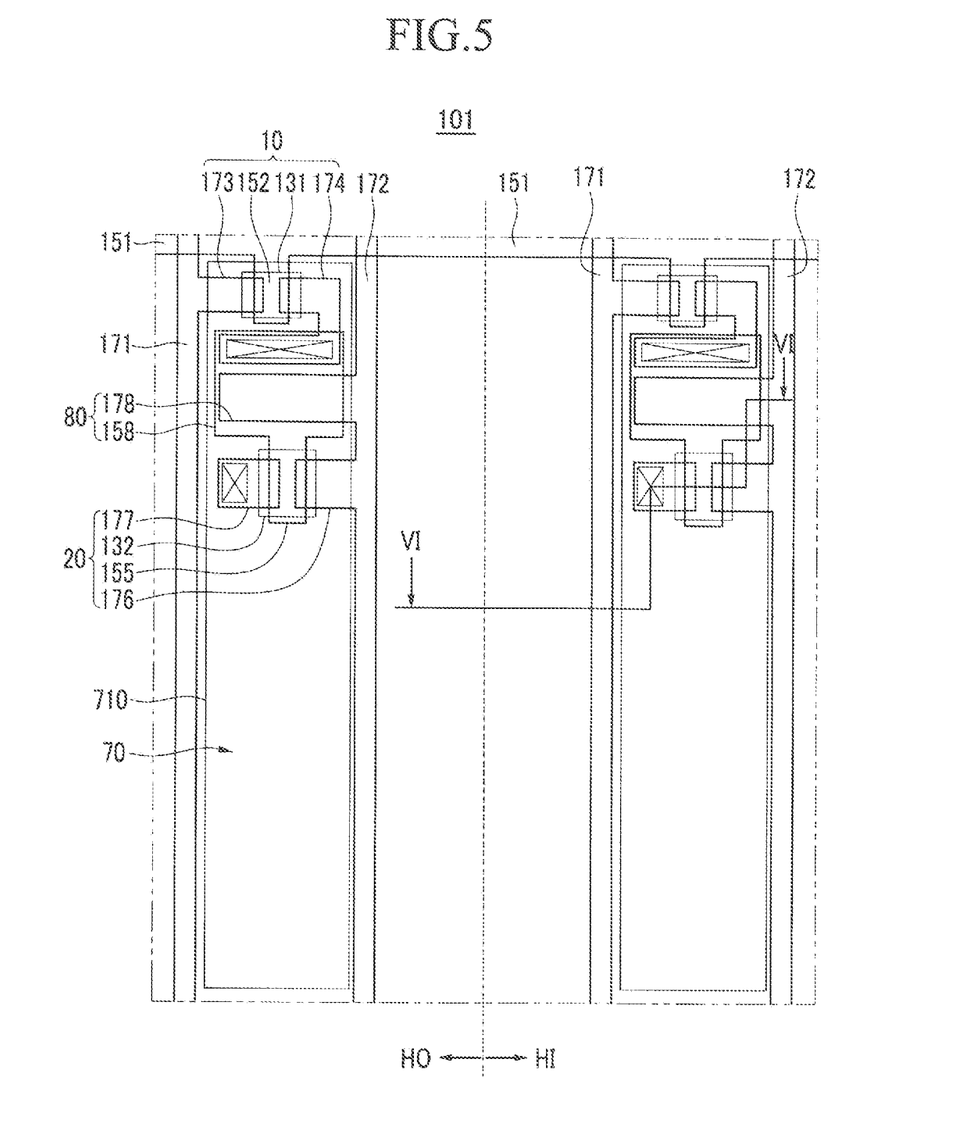
FIG. 5 is a layout view illustrating an enlarged internal structure of the organic light emitting diode (OLED) display shown in FIG. 1.

The driving circuit DC includes thin film transistors 10 and 20 (as shown in FIG. 5), and drives the organic light emitting element 70. The organic light emitting element 70 emits light according to a driving signal transmitted from the driving circuit DC, thereby displaying images.

Figure 6:
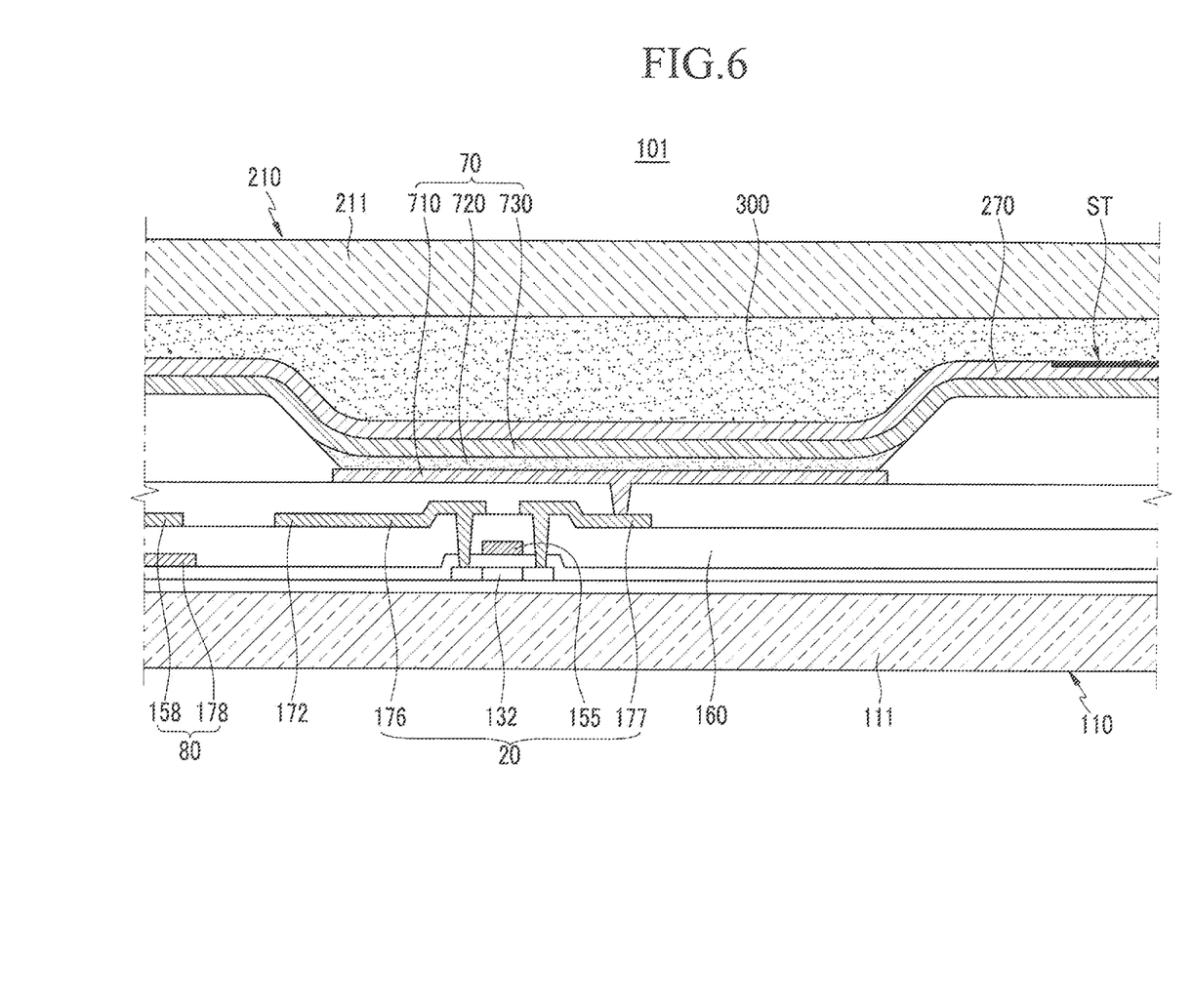
FIG. 6 is a cross-sectional view taken along the line VI-VI of FIG. 5.

The detailed structure of the organic light emitting element 70 and the driving circuit DC are shown in FIG. 5 and FIG. 6, however the first exemplary embodiment is not limited by the structure shown in FIG. 5 and FIG. 6. The organic light emitting element 70 and the driving circuit DC may be variously modified within a range that can be realized by a person skilled in the art.

The encapsulation substrate 210 is arranged opposite to the display substrate 110 thereby covering the organic light emitting element 70 and the driving circuit DC of the display substrate 110. The encapsulation substrate 210 includes the second substrate main body 211 made of a transparent material such as glass or plastic.

The sealant 350 is disposed between the edges of the display substrate 110 and the encapsulation substrate 210, thereby bonding the display substrate 110 and the encapsulation substrate 210.

The filler 300 is disposed between the display substrate 110 and the encapsulation substrate 210, thereby filling the space between the display substrate 110 and the encapsulation substrate 210. Also, the filler 300 may be made of a resin material, a liquid crystal material, or various other known materials.

The filler 300 is filled in the empty space between the display substrate 110 and the encapsulation substrate 210 such that the mechanical strength of the organic light emitting diode (OLED) display 101 may be improved. That is, the filler 300 is filled in the inner part of the organic light emitting diode (OLED) display 101 such that durability against external impact is improved.

At least one of the display substrate 110 and the encapsulation substrate 210 has one surface that is contacted with the filler 300 and is subjected to a surface treatment ST, such that the one surface is divided into a hydrophobic region HO and a hydrophilic region HI. In FIG. 1, the display substrate 110 is subjected to the surface treatment ST thereby being divided into the hydrophobic region HO and the hydrophilic region HI, however the first exemplary embodiment is not limited thereto. That is, the encapsulation substrate 210 may be divided into the hydrophobic region HO and the hydrophilic region HI.

Figure 2:
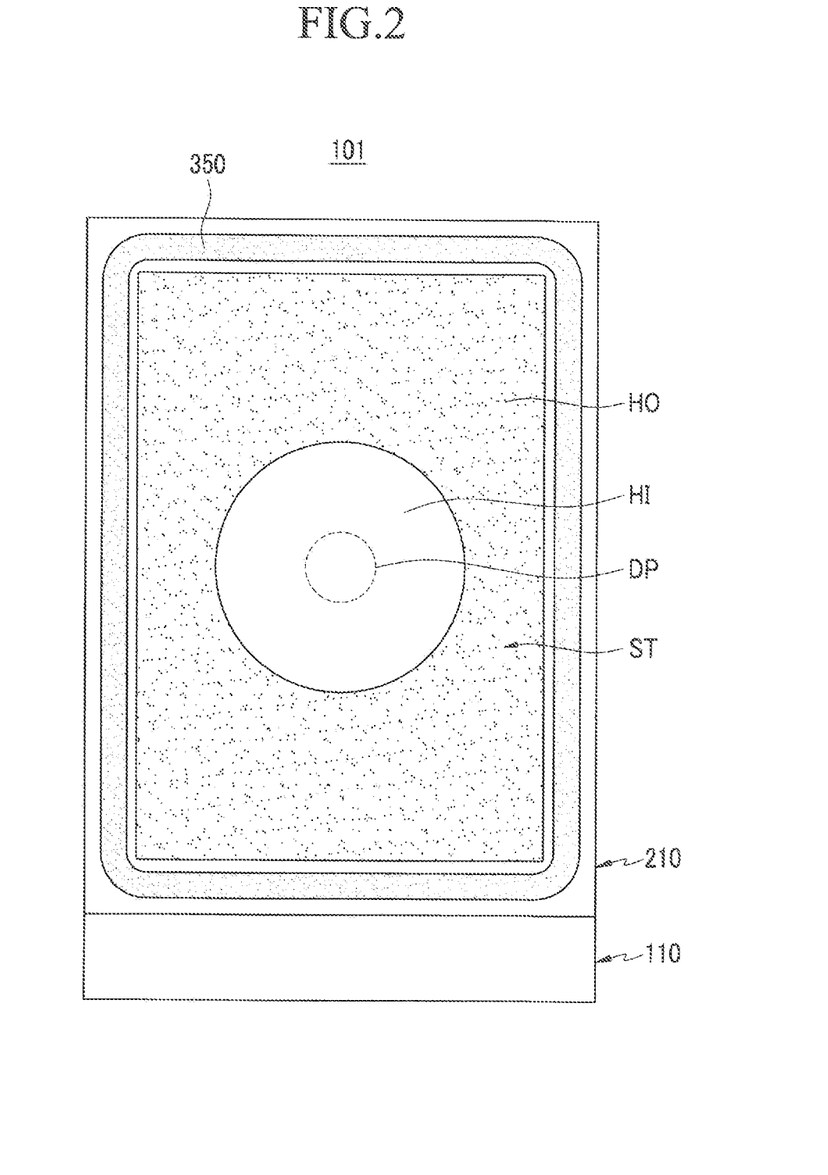
FIG. 2 is a layout view illustrating the OLED display of FIG. 1.

In detail, as shown in FIG. 2, the region that is not subjected to the surface treatment ST is the hydrophilic region HI, and the region that is subjected to the surface treatment ST is the hydrophobic region HO. Here, the hydrophobic region HO is disposed between the hydrophilic region HI and the sealant 350. In detail, in the first exemplary embodiment, the hydrophilic region HI is disposed at the center with a generally circular shape, and the hydrophobic region HO encloses the hydrophilic region HI. Also, the hydrophilic region HI includes a drop point DP, and the hydrophobic region HO is disposed close to the sealant.

The filler 300 (shown in FIG. 1) has a higher contact angle in the hydrophobic region HO than the hydrophilic region HI. Also, the filler 300 is dripped from the drop point DP disposed in the hydrophilic region HI, and diffuses in the direction of the sealant 350. Here, the hydrophobic region HO controls the diffusion and flow of the filler 300. That is, the hydrophobic region HO suppresses the unfavorable effects generated by excessively quick contact of the filler 300 that starts to drip from the drop point DP, with the sealant 350, and which produces hardening of the sealant 350.

Hereafter, a method for forming the hydrophobic region HO on the display substrate 110 through a surface treatment ST will be described.

Figure 3:
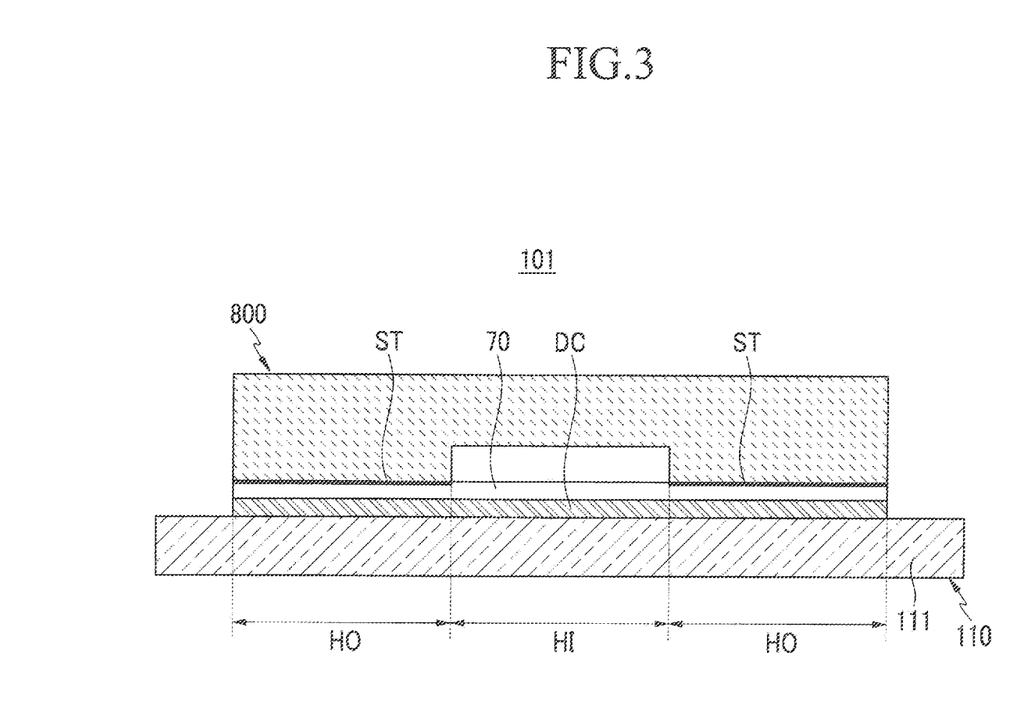
FIG. 3 and FIG. 4 are cross-sectional views sequentially showing a portion of a manufacturing process of the organic light emitting diode (OLED) display shown in FIG. 1.

The hydrophobic region HO may be made by contacting a material including polydimethylsiloxane (PDMS) with the substrate. In detail, as shown in FIG. 3, a mold 800 made of a thermal hardening material including PDMS is contacted with one surface of the display substrate 110, thereby forming a hydrophobic region HO. The region that is contacted with the material including the PDMS becomes hydrophobic when the —OH group of the terminal group of the surface thereof is removed.

By using this characteristic, if the mold 800 having a pattern of a groove formed on the central part is contacted with the display substrate 110, the region that is contacted with the mold 800 becomes the hydrophobic region HO and the region that is not contacted with the mold 800 becomes the hydrophilic region HI.

Also, the hydrophobic region HO may be made by printing a hydrophobic ink. The hydrophobic ink includes at least one of polytetrafluoroethylene (PTFE), fluoroethylenepropylene (FEP), perfluoroalkoxy (PFA) or polyvinylidene fluoride (PVDF). For example, the hydrophobic ink may be a mixture of FC722 and FC40 of 3M Co. Ltd., CYTOP™ CTL-809M and CT-solv 180 of Asahi Glass Co. Ltd., or Teflon AF and an exclusive use solvent of DuPont Co. Ltd. The display substrate 110 on which the hydrophobic region HO will be formed is brought to a predetermined temperature, and then hydrophobic ink is printed while maintaining the temperature of the display substrate 110. Then, the display substrate 110 printed with the hydrophobic ink is heat-treated to form the hydrophobic region HO. Also, the hydrophobic region HO may be formed on the encapsulation substrate 210 by the same method.

Also, although not shown, the organic light emitting diode (OLED) display 101 may further include a plurality of spacers formed on at least one of the display substrate 110 and the encapsulation substrate 210, thereby maintaining an interval between the display substrate 110 and the encapsulation substrate 210.

The spacers are contacted with the display substrate 110 and the encapsulation substrate 210 such that they prevent the organic light emitting element 70 for the display substrate 110 from being damaged, or deterioration from occurring.

With the above-described configuration, the durability of the organic light emitting diode (OLED) display 101 against impact is improved, and deterioration of the sealant may be suppressed.

Figure 4:
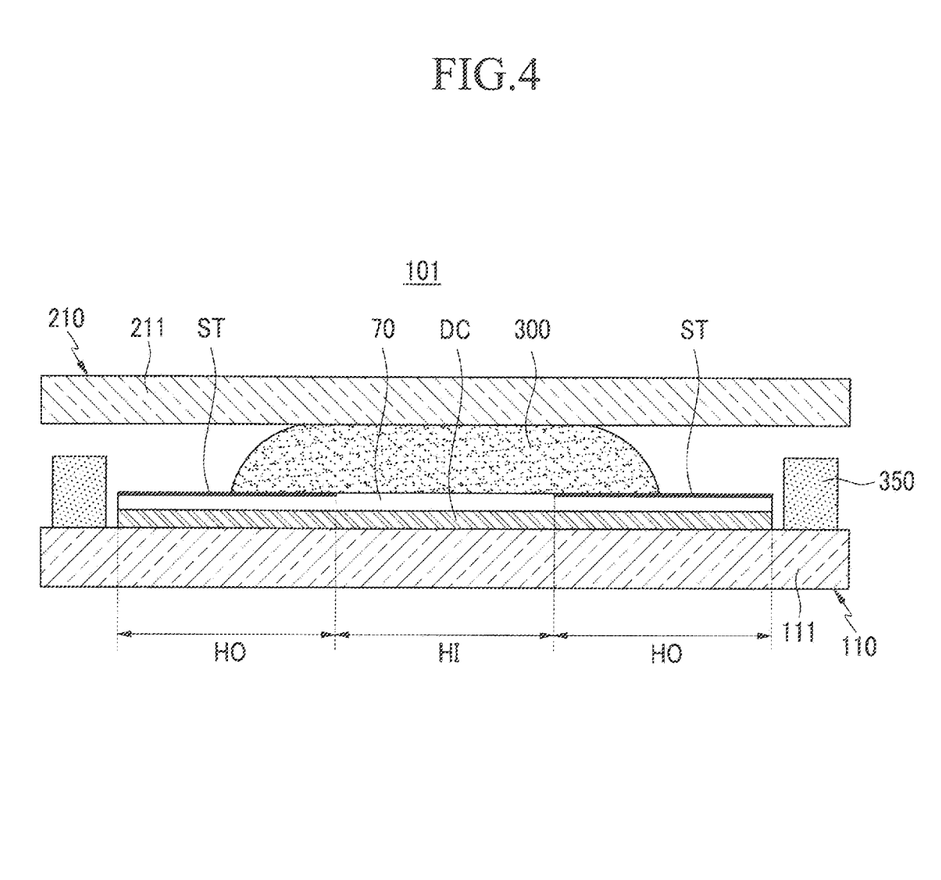

Next, a manufacturing method of an organic light emitting diode (OLED) display 101 according to the first exemplary embodiment will be described with reference to FIG. 3 and FIG. 4.

First, as shown in FIG. 3, the display substrate 110 is subjected to surface-treatment ST thereby dividing it into a hydrophilic region HI and a hydrophobic region HO enclosing the hydrophilic region HI. Here, the region that is subjected to the surface treatment ST is the hydrophobic region HO, and a drop point DP is disposed on the hydrophilic region HI that is not subjected to the surface treatment ST. However, the first exemplary embodiment is not limited thereto, for example the surface treatment ST may be executed for the encapsulation substrate 210 rather than the display substrate 110, with the encapsulation substrate 210 thereby being divided into a hydrophilic region HI and a hydrophobic region HO.

The hydrophobic region HO may be formed by contacting a mold 800 made of material including the PDMS with the display substrate. Also, to form the hydrophobic region HO, the hydrophobic ink including one of polytetrafluoroethylene (PTFE), fluoroethylenepropylene (FEP), perfluoroalkoxy (PFA), or polyvinylidene fluoride (PVDF) may be printed.

Also, the hydrophilic region HI is formed with a generally circular shape, and the drop point DP is disposed at, or near, the center of the hydrophilic region HI.

Next, a sealant 350 is formed on the display substrate 110 on the edge of the display substrate 110. Here, the sealant 350 is formed close to the hydrophobic region HO. Here, the sealant 350 is not always disposed on the display substrate 110. Accordingly, the sealant 350 may be formed on the encapsulation substrate 210. However, when the sealant 350 is formed on the encapsulation substrate 210, the sealant 350 should be disposed close to the hydrophobic region HO while combining the display substrate 110 and the encapsulation substrate 210.

Next, a filler 300 is initially dripped at the drop point DP disposed on the hydrophilic region HI, and diffuses to the edge of the display substrate 110. Here, the hydrophobic region HO disposed close to the sealant 350 controls the diffusion and the flow of the filler 300 that is initially dripped at the drop point DP. The filler 300 has a high contact angle in the hydrophobic region HO rather than the hydrophilic region HI. Accordingly, the diffusion of the filler 300 is suppressed on the hydrophobic region HO. That is, the hydrophobic region HO maximally delays contact of the filler 300 and the sealant 350 with each other.

In this way, the hydrophobic region HO minimizes the unfavorable effect of hardening the sealant 350 by suppressing excessively quick contact of the filler 300 with the sealant 350.

Next, the display substrate 110 and the encapsulation substrate 210 are combined with the sealant 350 and the filler 300 interposed therebetween through a vacuum method. Then, the sealant 350 is hardened, thereby sealing the display substrate 110 and the encapsulation substrate 210.

Through this manufacturing method, the durability of the organic light emitting diode (OLED) display 101 against impact is improved, and sealant deterioration may be suppressed.

Next, an internal structure of the organic light emitting diode (OLED) display 101 will be described with reference to FIG. 5 and FIG. 6 in detail. FIG. 5 is a layout view illustrating an enlarged internal structure of the organic light emitting diode (OLED) display shown in FIG. 1, and FIG. 6 is a cross-sectional view taken along the line VI-VI of FIG. 5.

As shown in FIG. 5 and FIG. 6, the display substrate 110 includes a switching thin film transistor 10, a driving thin film transistor 20, a capacitor 80, and an OLED 70 in each pixel. Here, the configuration including the switching thin film transistor 10, the driving thin film transistor 20, and the capacitor 80 is referred to as a driving circuit DC. Also, the display substrate 110 further includes gate lines 151 disposed according to one direction, data lines 171 intersecting and insulated from the gate lines 151, and a common power line 172. Here, one pixel may be defined by the gate line 151, the data line 171, and the common power line 172, but it is not always limited thereto.

The organic light emitting element 70 includes a pixel electrode 710, an organic emission layer 720 formed on the pixel electrode 710, and a common electrode 730 formed on the organic emission layer 720. Here, the pixel electrode 710 is a positive (+) electrode or anode being a hole injection electrode, and the common electrode 730 is a negative (−) electrode or cathode being an electron injection electrode. However, the present invention is not necessarily limited thereto, and depending upon the driving method of the organic light emitting diode display 100, the pixel electrode 710 may be a cathode and the common electrode 730 may be an anode. Holes and electrons are injected from the pixel electrode 710 and the common electrode 730 into the organic emission layer 720. When excitons being combinations of the injected holes and electrons shift from an excited state to a ground state, light is emitted.

Furthermore, with an organic light emitting diode display according to the first exemplary embodiment, the organic light emitting diode 70 emits light in the direction of the encapsulation substrate 210. That is, the organic light emitting diode display 100 is a front emission type. Here, for the organic light emitting element 70 to emit light in the direction of the encapsulation substrate 210, the pixel electrode 710 is used as a reflective electrode and the common electrode 730 is used as a transmissive or translucent electrode. However, in the first exemplary embodiment, the organic light emitting diode (OLED) display 101 is not limited to the front light emitting type. Accordingly, the organic light emitting diode (OLED) display 101 may be a rear light emitting type or a dual side light emitting type.

The capacitor 80 has a pair of electrode plates 158 and 178, and an interlayer insulating layer 160 interposed between the two capacitor electrode plates 158 and 178. The interlayer insulating layer 160 functions as a dielectric. The capacitance is determined depending upon electric charges charged at the capacitor 80 and the voltages applied to the two capacitor electrode plates 158 and 178.

The switching thin film transistor 10 includes a switching semiconductor layer 131, a switching gate electrode 152, a switching source electrode 173, and a switching drain electrode 174. The driving thin film transistor 20 includes a driving semiconductor layer 132, a driving gate electrode 155, a driving source electrode 176, and a driving drain electrode 177.

The switching thin film transistor 10 is used as a switch for selecting the pixels to emit light. The switching gate electrode 152 is connected to the gate line 151. The switching source electrode 173 is connected to the data line 171. The switching drain electrode 174 is separated from the switching source electrode 173, and is connected to one capacitor electrode plate 158.

The driving thin film transistor 20 applies a driving voltage to the pixel electrode 710 to excite the organic emissive layer 720 of the first organic light emitting diode 70 in the selected pixel. The driving gate electrode 155 is connected to the capacitor electrode plate 158 that is connected with the switching drain electrode 174. The driving source electrode 176 and the other capacitor electrode plate 178 are each connected to the common power line 172. The driving drain electrode 177 is connected to the pixel electrode 710 of the organic light emitting diode 70 through a contact hole.

With the above structure, the switching thin film transistor 10 is operated by the gate voltage applied to the gate line 151, and transmits the data voltage applied to the data line 171 to the driving thin film transistor 2. A voltage corresponding to a difference between the common voltage applied to the driving thin film transistor 20 from the common power line 172 and the data voltage transmitted from the switching thin film transistor 10 is stored at the capacitor 80, and the current corresponding to the voltage stored at the capacitor 80 flows to the organic light emitting diode 70 through the driving thin film transistor 20 to thereby excite the organic light emitting diode 70.

Also, a capping layer 270 for protecting the organic light emitting element 70 is formed on the organic light emitting element 70. The capping layer 270 may be made of various organic materials or inorganic materials, and in the first exemplary embodiment, the capping layer 270 is subjected to surface treatment ST thereby being divided into a hydrophobic region HO and a hydrophilic region HI. However, the first exemplary embodiment is not limited thereto. Accordingly, the capping layer 270 may be omitted, and when the capping layer 270 is omitted, the organic light emitting element 70 is directly subjected to surface treatment ST such that it may be divided into a hydrophobic region HO and a hydrophilic region HI. Also, the other layer disposed on the organic light emitting element 70 may be subjected to surface treatment ST besides the capping layer 270 such that a hydrophobic region HO and a hydrophilic region HI may be divided.

On the organic light emitting element 70, as shown in FIG. 6, an encapsulation substrate 210 for protecting the organic light emitting element 70 is disposed.

Next, a second exemplary embodiment will be described with reference to FIG. 7.

Figure 7:
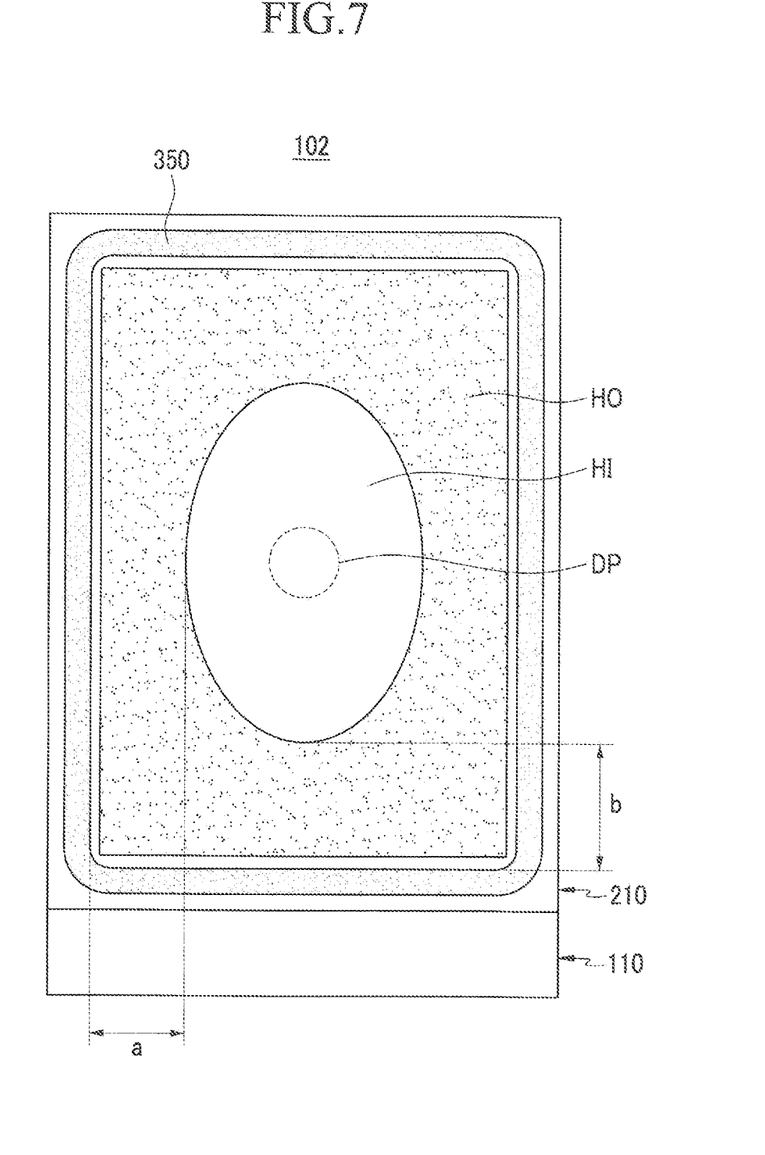
FIG. 7 is a top plan view of an organic light emitting diode (OLED) display according to the second exemplary embodiment.

As shown in FIG. 7, in an organic light emitting diode (OLED) display 102 according to the second exemplary embodiment, the hydrophilic region HI is formed with a generally oval shape, and a drop point DP is disposed at, or near, the center of the hydrophilic region HI. Also, the display substrate 110 is formed with a generally rectangular shape having a pair of long edges and a pair of shorter edges. Here, the long edges of a hydrophilic region HI of a generally oval shape are parallel to the long edges of the display substrate 110, and the short edges thereof are parallel to the short edges of the display substrate 110.

Also, the shortest distance (a) from the sealant 350 disposed on the long edge of the display substrate 110 to the hydrophilic region HI is approximately the same as the shortest distance (b) from the sealant 350 disposed on the short edge of the display substrate 110 to the hydrophilic region HI.

In this way, the hydrophilic region HI has a generally oval shape such that the difference between the required times from when the filler 300 starts to drip from the drop point DP and diffuses and respectively arrives to at long and short edges of the display substrate 110 may be reduced. That is, the deviation between the time when the filler 300 that starts to drip from the drop point DP contacts with the sealant 350 disposed on the short edge of the display substrate 110, and the time that the filler 300 contacts with the sealant 350 disposed on the long edge of the display substrate 110 may be reduced.

With the above-described configuration, the durability of the organic light emitting diode (OLED) display 102 against impact is improved, and sealant deterioration may be suppressed.

Also, a manufacturing method of an organic light emitting diode (OLED) display 102 according to the second exemplary embodiment is the same as the manufacturing method of the organic light emitting diode (OLED) display 101 according to the first exemplary embodiment except for the hydrophilic region HI with the generally oval shape.

Next, a third exemplary embodiment will be described with reference to FIG. 8.

Figure 8:
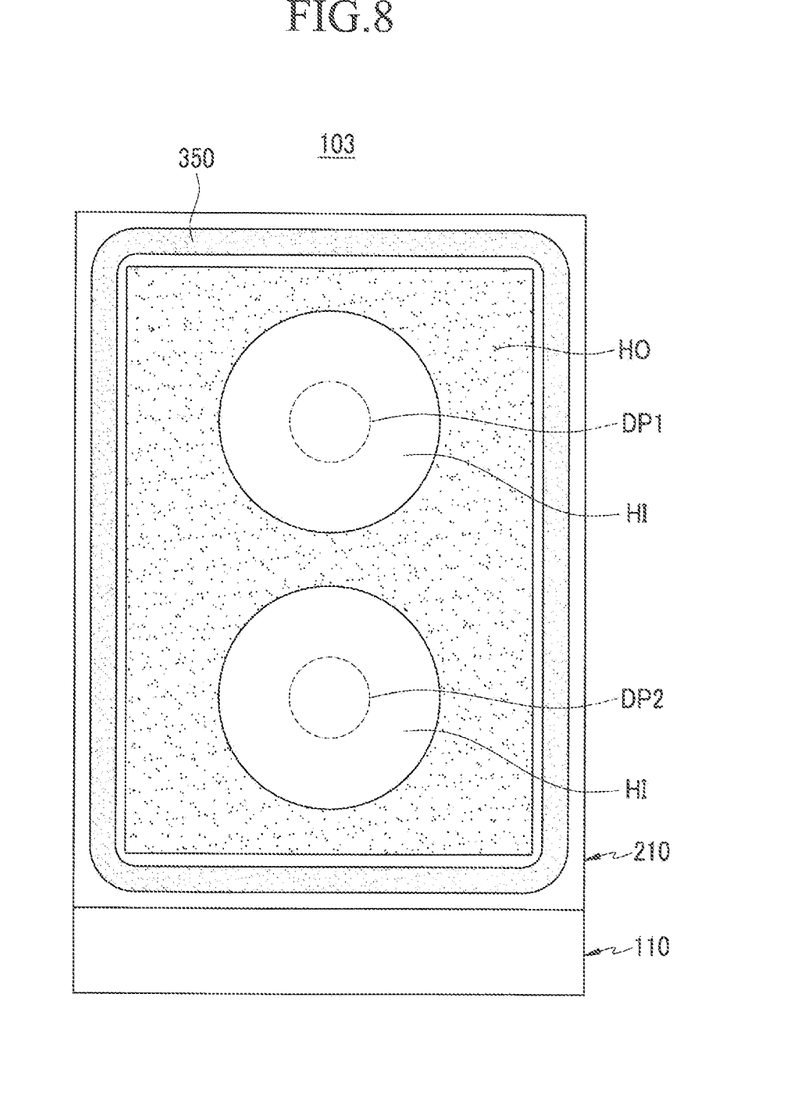
FIG. 8 is a top plan view of an organic light emitting diode (OLED) display according to the third exemplary embodiment.

As shown in FIG. 8, an organic light emitting diode (OLED) display 103 according to the third exemplary embodiment has at least two drop points DP1 and DP2. Also, at least two hydrophilic regions HI including the drop points DP1 and DP2 may be formed. The hydrophobic region HO encloses the hydrophilic regions HI and is formed close to the sealant 350 at the edge of the display substrate 110.

Also, the display substrate 110 is formed with a generally rectangular shape having a pair of long edges and a pair of short edges. Further, the drop points DP are arranged in a direction parallel to the long edge of the display substrate 110.

If the drop point DP is disposed in one central position of a display substrate 110 of a rectangular shape, the required times for the filler 300, which starts to drip from the drop point DP and diffuses, and arrives at the long edge and the short edge of the display substrate 110 are different from each other. That is, the filler 300 more quickly contacts with the sealant 350 formed on the long edge of the display substrate 110 than the sealant 350 formed along the short edge. Accordingly, the effects of the filler 300 on hardening the sealant 350 becomes non-uniform, such that sealant deterioration of the organic light emitting diode (OLED) display 103 may occur.

However, in the third exemplary embodiment, the organic light emitting diode (OLED) display 103 has at least two drop points DP, and the drop points DP are arranged in a direction parallel to the long edge of the display substrate 110 such that the deviation of the time for the filler 300 to contact the sealant 350 may be reduced.

With the above-described configuration, the durability of the organic light emitting diode (OLED) display 103 against impact is improved, and sealant deterioration may be suppressed.

Also, a manufacturing method of the organic light emitting diode (OLED) display 103 according to the third exemplary embodiment is the same as the manufacturing method of the organic light emitting diode (OLED) display 101 according to the first exemplary embodiment except for the fact that the filler 300 is dripped at the least drop points DP and diffuses to the edge of the display substrate 110.

Next, a fourth exemplary embodiment will be described with reference to FIG. 9.

Figure 9:
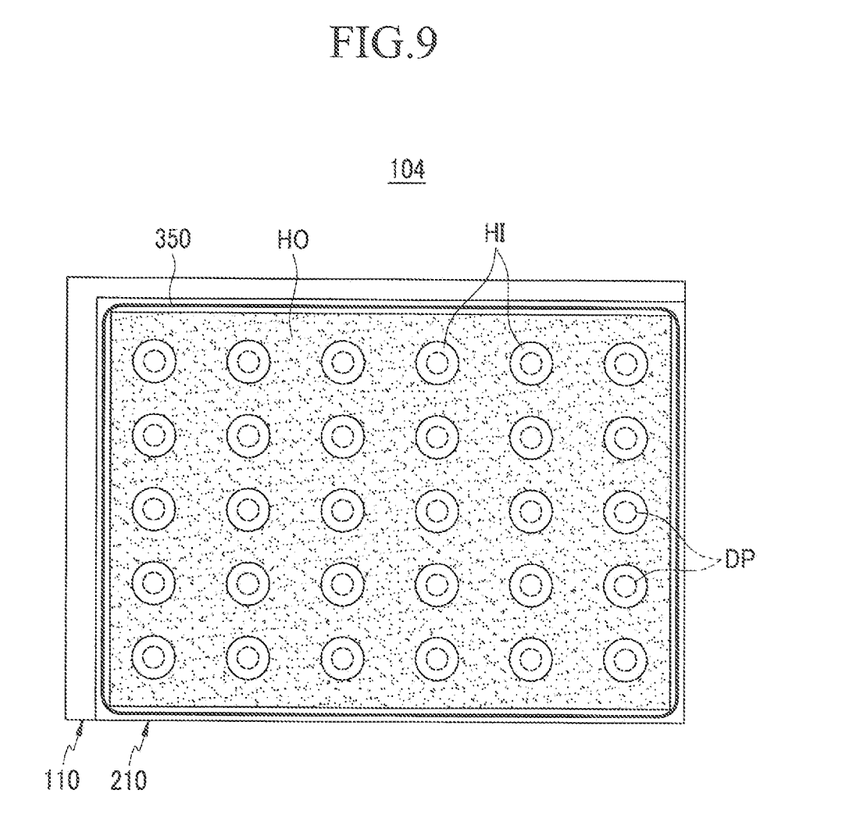
FIG. 9 is a top plan view of an organic light emitting diode (OLED) display according to the fourth exemplary embodiment.

As shown in FIG. 9, an organic light emitting diode (OLED) display 104 according to the fourth exemplary embodiment has a plurality of drop points DP. Also, a plurality of hydrophilic regions HI respectively including a plurality of drop points DP may be formed. The hydrophobic region HO encloses the hydrophilic regions HI and is formed close to the sealant 350 at the edge of the display substrate 110.

Further, a plurality of drop points DP are distributed on the display substrate 110 along with the hydrophilic region HI. Here, a plurality of drop points DP may be distributed uniformly or non-uniformly. If the plurality of drop points DP are non-uniformly distributed, they may be more closely distributed toward the center of the display substrate 110.

With the above-described configuration, even if the size of the display substrate 110 becomes large, the filler 300 may quickly diffuse through the plurality of drop points DP, and simultaneously the hydrophobic region HO suppresses the unfavorable effects generated by excessively quick contact of the filler 300, that starts to drip from a drop point DP, with the sealant 350 in hardening the sealant 350.

Also, a manufacturing method of the organic light emitting diode (OLED) display 104 according to the fourth exemplary embodiment is the same as the manufacturing method of the organic light emitting diode (OLED) display 101 according to the first exemplary embodiment except for the fact that the filler 300 is dripped at the plurality of drop points DP and diffuses to the edge of the display substrate 110.

Next, a fifth exemplary embodiment will be described with reference to FIG. 10.

Figure 10:
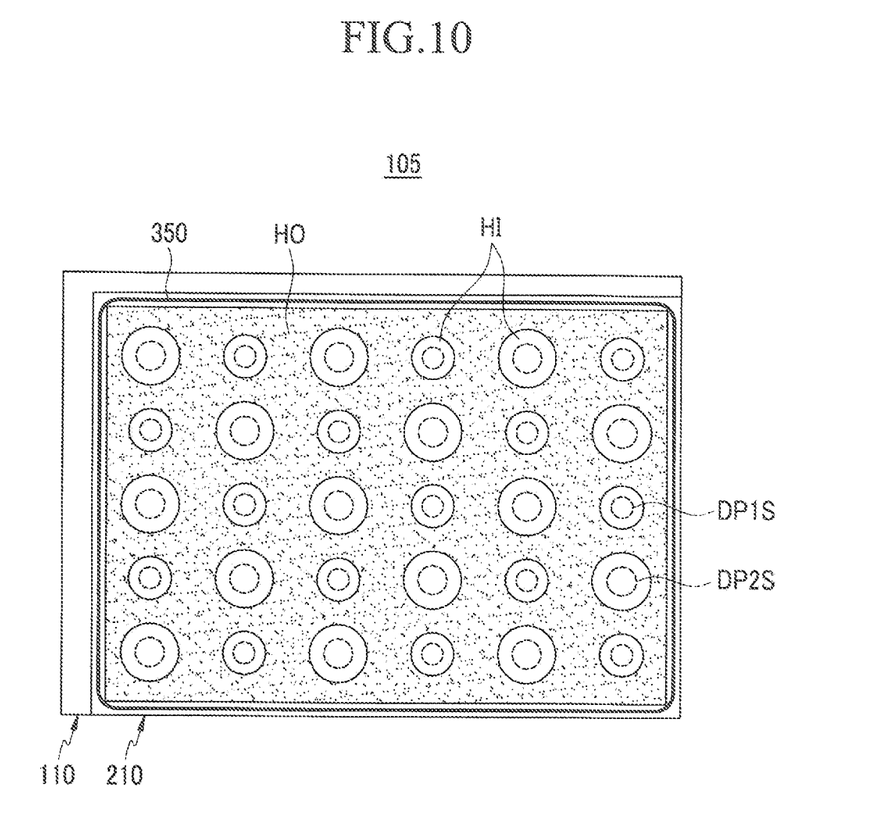
FIG. 10 is a top plan view of an organic light emitting diode (OLED) display according to the fifth exemplary embodiment.

As shown in FIG. 10, an organic light emitting diode (OLED) display 105 according to the fifth exemplary embodiment has a plurality of drop points DP1S and DP2S having various sizes. That is, a plurality of drop points DP1S and DP2S may have two or more sizes. Also, the hydrophilic regions HI including the drop points DP1S and DP2S have various sizes according to the sizes of the drop points DP1S and DP2S. The hydrophobic region HO encloses the hydrophilic regions HI, and is formed close to the sealant 350 at the edge of the display substrate 110.

In detail, the plurality of drop points include the first drop point DP1S and the second drop point DP2S having a larger size than the first drop point DP1S, and a hydrophilic region HI including the first drop point DP1S is smaller than the hydrophilic region HI including the second drop point DP2S. The first drop point DP1S and the second drop point DP2S are alternately arranged.

Also, the amount of the filler 300 that is dripped through the first drop point DP1S is less than the amount of the filler 300 that is dripped through the second drop point DP2S.

With the above-described configuration, even if the size of the display substrate 110 becomes large, the filler 300 may be stably, quickly, and uniformly diffused through the drop points DP1S and DP2S having various sizes, and simultaneously the hydrophobic region HO suppresses the unfavorable effects generated by excessively quick contact of the filler 300 that starts to drip from a drop point DP, with the sealant 350, in hardening the sealant 350.

Also, a manufacturing method of an organic light emitting diode (OLED) display 105 according to the fifth exemplary embodiment is the same as the manufacturing method of the organic light emitting diode (OLED) display 101 according to the first exemplary embodiment except for the fact that the filler 300 is dripped with different amounts at the plurality of drop points DP1S and DP2S and diffuses to the edge of the display substrate 110.

Next, a sixth exemplary embodiment will be described with reference to FIG. 11.

Figure 11:
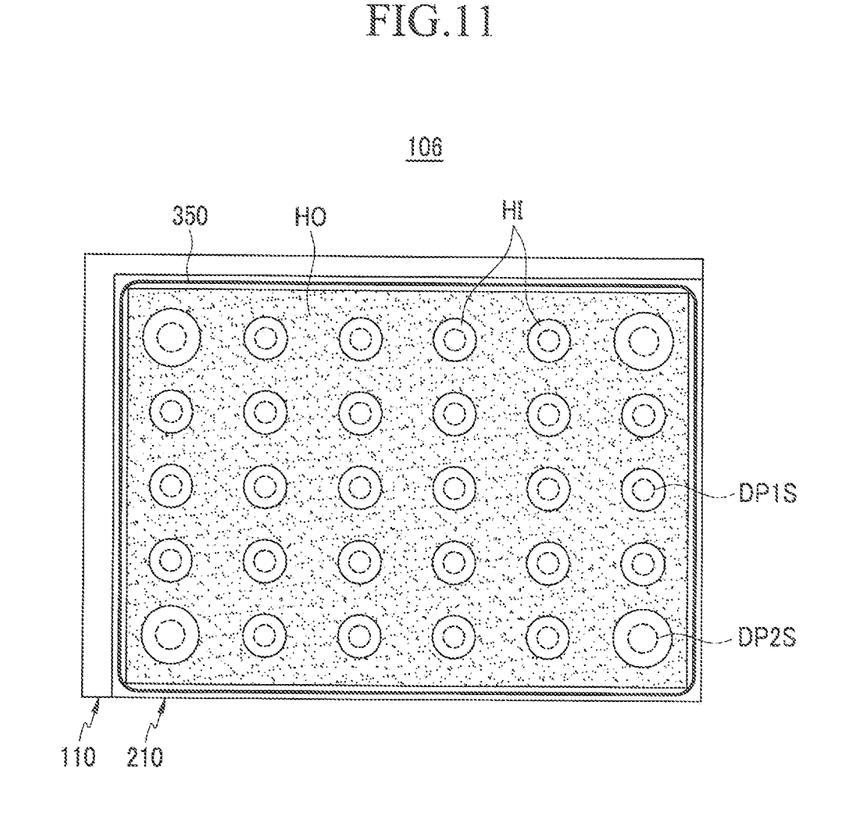
FIG. 11 is a top plan view of an organic light emitting diode (OLED) display according to the sixth exemplary embodiment.

As shown in FIG. 11, an organic light emitting diode (OLED) display 106 according to the sixth exemplary embodiment has a plurality of drop points DP1S and DP2S having various sizes. That is, a plurality of drop points DP1S and DP2S may have two or more sizes. Also, the hydrophilic regions HI including the drop points DP1S and DP2S have various sizes according to the sizes of the drop points DP1S and DP2S. The hydrophobic region HO encloses the hydrophilic regions HI and is simultaneously formed close to the sealant 350 at the edge of the display substrate 110.

In detail, the plurality of drop points include the first drop point DP1S and the second drop point DP2S having a larger size than the first drop point DP1S, and the hydrophilic region HI including the first drop point DP1S is smaller than the hydrophilic region HI including the second drop point DP2S. Also, the second drop point DP2S is positioned close to each corner of the display substrate 110, and the first drop point DP1S is generally uniformly distributed over the remaining region.

Further, the amount of the filler 300 that is dripped through the first drop point DP1S is less than the amount of the filler 300 that is dripped through the second drop point DP2S.

With the above-described configuration, even if the size of the display substrate 110 becomes large, the filler 300 may be stably, quickly, and uniformly diffused through the drop points DP1S and DP2S having the various sizes. Particularly, the second drop point DP2S is positioned close to the corner of the display substrate 110 and the filler 300 with the relatively larger amount is dripped on the second drop point DP2S such that the filler 300 may be smoothly diffused to the corner of the display substrate 110.

Also, a manufacturing method of the organic light emitting diode (OLED) display 106 according to the sixth exemplary embodiment is the same as the manufacturing method of the organic light emitting diode (OLED) display 101 according to the first exemplary embodiment, except for the fact that the filler 300 is dripped with different amounts at the plurality of drop points DP1S and DP2S and diffuses to the edge of the display substrate 110.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode (OLED) display device, comprising:
   a display substrate including an organic light emitting element;
   an encapsulation substrate arranged opposite to the display substrate and covering the organic light emitting element;
   a sealant disposed on the edge of the display substrate and the encapsulation substrate, the sealant in contact with the display substrate and the encapsulation substrate;
   a filler substantially filling the space between the display substrate and the encapsulation substrate,
   one surface of at least one of the display substrate or the encapsulation substrate being in contact with the filler and is divided into a hydrophobic region and a hydrophilic region, and
   the hydrophobic region being between the hydrophilic region and the sealant.

2. The organic light emitting diode (OLED) display device of claim 1, wherein:
   the hydrophilic region includes a drop point, and
   the filler is dripped from the drop point and diffuses in a sealant direction.

3. The organic light emitting diode (OLED) display device of claim 1, wherein:
   the filler has a higher contact angle in the hydrophobic region than the hydrophilic region.

4. The organic light emitting diode (OLED) display device of claim 1, wherein:
   the hydrophobic region comprises a region contacted with a material including polydimethylsiloxane (PDMS).

5. The organic light emitting diode (OLED) display deviec of claim 1, wherein:
   the hydrophobic region comprises a hydrophobic ink.

6. The organic light emitting diode (OLED) display device of claim 5, wherein:
   the hydrophobic ink includes at least one of polytetrafluoroethylene (PTFE), fluoroethylenepropylene (FEP), perfluoroalkoxy (PFA) or polyvinylidene fluoride (PVDF).

7. The organic light emitting diode (OLED) display device of claim 1, wherein:
   the hydrophilic region is disposed on the central part of the display or encapsulation substrate, and the hydrophobic region encloses the hydrophilic region.

8. The organic light emitting diode (OLED) display device of claim 1, wherein:
   the hydrophilic region has a generally circular shape.

9. The organic light emitting diode (OLED) display device of claim 1, wherein:
   the hydrophilic region has a generally oval shape including a long axis parallel to the long edge of the display substrate and a short axis parallel to the short edge of the display substrate.

10. The organic light emitting diode (OLED) display device of claim 1, wherein:
    two or more drop points for dripping filler are disposed on the display or encapsulation substrate, and the drop points are arranged in the direction parallel to the long edge of the display substrate.

11. The organic light emitting diode (OLED) display device of claim 1, wherein:
a plurality of drop points for dripping filler are disposed on the display or encapsulation substrate, and
the plurality of drop points are distributed on a plurality of hydrophilic regions.

12. The organic light emitting diode (OLED) display device of claim 11, wherein:
the plurality of drop points have various sizes, and
the plurality of hydrophilic regions including the plurality of drop points have various sizes.

13. The organic light emitting diode (OLED) display device of claim 12, wherein:
the plurality of drop points include a first drop point and a second drop point having a larger size than the first drop point,
the hydrophilic region including the second drop point is larger than the hydrophilic region including the first drop point, and
the amount of filler dripped through the first drop point is smaller than the amount of filler dripped through the second drop point.

14. The organic light emitting diode (OLED) display device of claim 13, wherein:
the first drop point and the second drop point are alternately arranged.

15. The organic light emitting diode (OLED) display device of claim 13, wherein:
a second drop point is disposed close to each corner of the display substrate.

16. A method for manufacturing an organic light emitting diode (OLED) display device, comprising:
surface-treating at least one of a display substrate or an encapsulation substrate thereby dividing it into a hydrophilic region and a hydrophobic region enclosing the hydrophilic region;
positioning a drop point for dripping filler onto the display or encapsulation substrate in the hydrophilic region;
forming a sealant on at least one of the display substrate or the encapsulation substrate on the edge of the substrate;
dripping filler at the drop point and allowing the filler to diffuse to the surrounding region; and
contacting the display substrate and the encapsulation substrate with the sealant and the filler interposed therebetween,
wherein the encapsulation substrate covers the organic light emitting element, the sealant is in contact with the display substrate and the encapsulation substrate, the filler substantially, fills the space between the display substrate and the encapsulation substrate, and the hydrophobic region is between the hydrophilic region and the sealant.

17. The method of claim 16, wherein
the hydrophobic region is disposed close to the sealant.

18. The method of claim 16, wherein
the filler has a higher contact angle in the hydrophobic region than the hydrophilic region.

19. The method of claim 16, wherein
the hydrophobic region is formed by contact with a material including polydimethylsiloxane (PDMS).

20. The method of claim 16, wherein
the hydrophobic region is formed by printing a hydrophobic ink.

21. The method of claim 20, wherein
the hydrophobic ink includes at least one of polytetrafluoroethylene (PTFE), fluoroethylenepropylene (FEP), perfluoroalkoxy (PFA), or polyvinylidene fluoride (PVDF).

22. The method of claim 16, wherein
the hydrophilic region has a circular shape.

23. The method of claim 16, wherein
the hydrophilic region has an oval shape including a long axis parallel to the long edge of the display substrate and a short axis parallel to the short edge of the display substrate.

24. The method of claim 16, wherein
two or more drop points are disposed, and the drop points are arranged in a direction parallel to the long edge of the display substrate.

25. The method of claim 16, wherein
a plurality of drop points are disposed having various sizes, and
the plurality of drop points are distributed on a plurality of the hydrophilic regions.

26. The method of claim 25, wherein
the plurality of drop points have various sizes, and
the plurality of hydrophilic regions including the plurality of drop points have various sizes.

27. The method of claim 26, wherein
the plurality of drop points include a first drop point and a second drop point having a larger size than the first drop point, the hydrophilic region including the second drop point is larger than the hydrophilic region including the first drop point, and
the amount of the filler dripped through the first drop point is smaller than the amount of the filler dripped through the second drop point.

28. The method of claim 27, wherein
the first drop point and the second drop point are alternately arranged.

29. The method of claim 27, wherein
the second drop point is disposed close to each corner of the display substrate.

* * * * *